United States Patent
Sigal et al.

(10) Patent No.: US 7,589,565 B2
(45) Date of Patent: Sep. 15, 2009

(54) LOW-POWER MULTI-OUTPUT LOCAL CLOCK BUFFER

(75) Inventors: Leon J. Sigal, Monsey, NY (US); James D. Warnock, Somers, NY (US); Dieter F. Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 12/024,753

(22) Filed: Feb. 1, 2008

(65) Prior Publication Data

US 2009/0199038 A1    Aug. 6, 2009

(51) Int. Cl.
*H03K 19/00* (2006.01)

(52) U.S. Cl. .............................. 326/93; 326/96; 326/97

(58) Field of Classification Search ............. 326/93–98; 327/164–167, 172, 176, 291, 295
See application file for complete search history.

(56) References Cited

U.S. PATENT DOCUMENTS

| | | | |
|---|---|---|---|
| 2008/0100360 A1* | 5/2008 | Ngo et al. | 327/172 |
| 2008/0101522 A1* | 5/2008 | Ngo et al. | 375/372 |

* cited by examiner

*Primary Examiner*—Anh Q Tran
(74) *Attorney, Agent, or Firm*—Yee & Associates, P.C.; Matthew W. Baca

(57) ABSTRACT

An improved circuit for reducing a capacitance load on a processor. The circuit includes a global clock circuit capable of producing a primary timing signal. The circuit further includes a local clock buffer circuit having a plurality of outputs. The local clock buffer circuit is connected to the global clock circuit. The local clock buffer circuit is capable of producing a secondary timing signal based on the primary timing signal. The circuit also includes a latch connected to the local clock buffer circuit. The latch is capable of producing a select signal that controls which outputs of the plurality of outputs are active. Only a third signal, based on the secondary timing signal, controls an operation of the latch.

20 Claims, 4 Drawing Sheets

LOW-POWER MULTI-OUTPUT LOCAL CLOCK BUFFER

This invention was made with Government support under DARPA, HR0011-07-9-0002 PERCS Phase III. THE GOVERNMENT HAS CERTAIN RIGHTS IN THIS INVENTION.

BACKGROUND

1. Field of the Invention

The present application relates generally to an improved processor unit design. In particular, the present application relates to improved methods for reducing power consumption in processor units. Still more particularly, the present application relates to improved circuits for reducing a capacitive load on a global clock grid of a processor unit.

2. Description of the Related Art

Modern processor units, including those processor units used in personal computers, use extremely fast, precise clocks as timing mechanisms to aid in the transfer of data in the processor unit and in other computer components. These clocks operate on about the same scale as the processor unit cycles, which today are usually measured in gigahertz; or, one billion cycles per second.

Thus, the clocks in modern processor units keep time to about several hundred picoseconds or less. A picosecond is one-trillionth of a second.

In many cases, a "global clock" acts as a master timekeeper for the processor unit. However, with respect to the time periods in which processor units operate, the physical size of the processor unit, in conjunction with the speed at which signals propagate, can lead to skews in timing with respect to different parts of the processor unit. For example, as a theoretical limit, the speed of light is about one foot per nanosecond. A nanosecond is one billionth of a second. Thus, for a theoretical processor unit that was one foot across, a full nanosecond would be required to transmit a timing signal from one end of the processor unit to the other. Because the processor unit is operating at a speed of more than one cycle per nanosecond, this timing difference throughout the processor unit could result in major errors.

Although this example is extreme in a number of senses, the example conveys the nature of some of the real difficulties in timing operations within a processor unit. One method of addressing this problem has been to use local clock buffers on different physical parts of a processor unit. A local clock buffer uses the timing signal of the global clock to generate secondary time keeping signals that can be adjusted with respect to the global clock signal. The secondary time keeping signals are used by circuits located physically near the local clock buffer. In this manner, in further conjunction with placing multiple local clock buffers throughout a processor unit, a processor unit can more accurately track timing throughout the processor unit.

Local clock buffers usually have multiple outputs. Each output can be connected to a different circuit in the physical vicinity of the local clock buffer. Controlling, in a stable manner, which of these outputs are active in a given cycle is a challenging problem. An even greater problem is that the entire processor unit and each circuit within the processor unit (including the local clock buffers) should consume as little power as possible.

SUMMARY

The illustrative embodiments provide for an improved circuit for reducing a capacitance load on a processor. The circuit includes a global clock circuit capable of producing a primary timing signal. The circuit further includes a local clock buffer circuit having a plurality of outputs. The local clock buffer circuit is connected to the global clock circuit. The local clock buffer circuit is capable of producing a secondary timing signal based on the primary timing signal. The circuit also includes a latch connected to the local clock buffer circuit. The latch is capable of producing a select signal that controls which outputs of the plurality of outputs are active. Only a third signal, based on the secondary timing signal, controls an operation of the latch.

BRIEF DESCRIPTION OF THE DRAWINGS

The novel features believed characteristic of the illustrative embodiments are set forth in the appended claims. The illustrative embodiments themselves, however, as well as a preferred mode of use, further objectives and advantages thereof, will best be understood by reference to the following detailed description of the illustrative embodiments when read in conjunction with the accompanying drawings, wherein:

DETAILED DESCRIPTION OF THE PREFERRED EMBODIMENT

Figure 1:
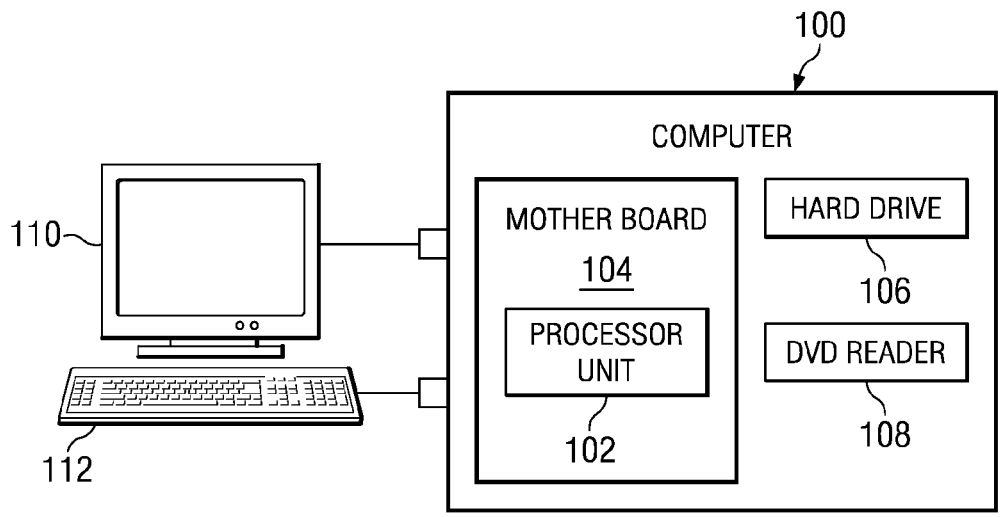
FIG. 1 shows a prior art computer, in which the illustrative embodiments may be implemented.

FIG. 1 shows a prior art computer, in which the illustrative embodiments may be implemented. Computer 100 is a personal computer, as shown in FIG. 1; however, Computer 100 can be any computing device, such as a personal digital assistant (PDA), mobile phone, calculator, or other electronic device. Processor unit 102 can be considered the core of computer 100. Physically, processor unit 102 is located on motherboard 104. Motherboard 104 contains other electronics that, in conjunction with hard drive 106 and DVD (digital video disk) reader 108 allows computer 100 to operate in a manner expected of most personal computers. For example, computer 100 can be connected to monitor 110 to display data, such as pictures, manipulated by processor unit 102. Additionally, computer 100 can be connected to keyboard 112, through which a user can enter data to be manipulated by processor unit 102.

Processor unit 102 in this example is shown as a processor unit in a personal computer. However, for purposes of the illustrative embodiments described herein, processor unit 102 can be any integrated circuit which contains one or more processor unit clocks or local clock buffers. Processor unit 102 can be multiple processors acting in parallel as a multi-processor unit. Processor unit 102 can also be multiple processors coordinating with each other in some other way.

Figure 2:
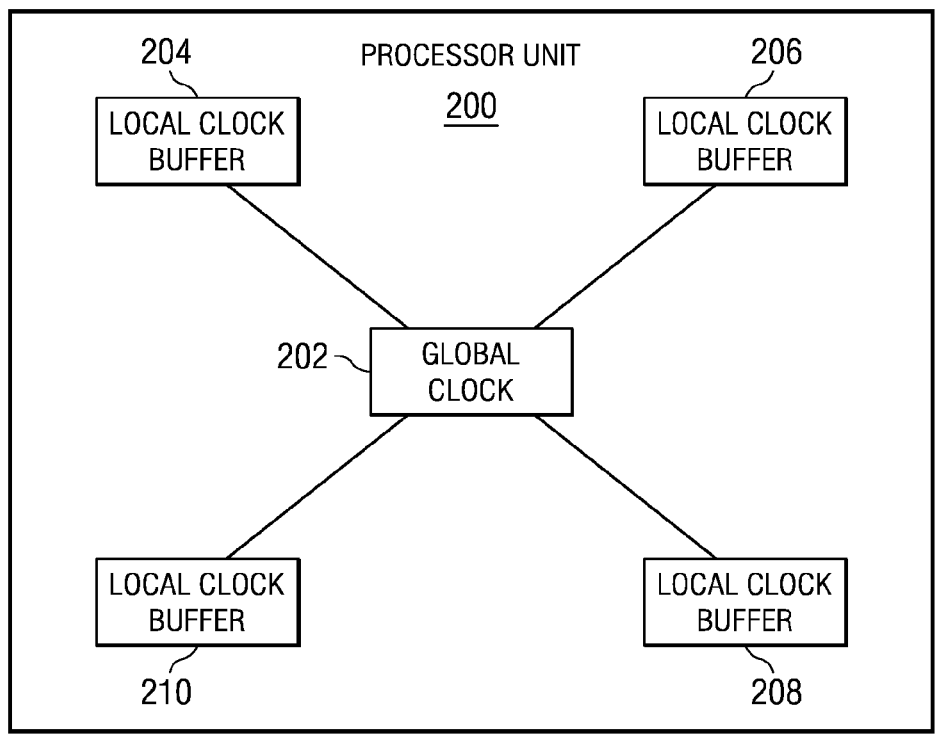
FIG. 2 shows a prior art processor unit, in which the illustrative embodiments may be implemented.

FIG. 2 shows a prior art processor unit, in which the illustrative embodiments may be implemented. Processor unit 200 is similar to processor unit 102 described with respect to FIG. 1. Thus, processor unit 200 can be any processor unit which contains one or more processor unit clocks or local clock buffers.

In particular, processor unit 200 includes global clock 202. Global clock 202 acts as a master timekeeper device used to accurately time actions and movement of data within processor unit 200. Because processor unit 200 operates at very high cycle rates, possibly several billion cycles per second, global clock 202 keeps time in segments of about several hundred picoseconds or less.

However, the timing signals from global clock 202 take time to travel across the physical space of processor unit 200. Although such signals travel very fast from the perspective of normal human experience, because processor unit 200 operates in billions of cycles per second, the travel time of the timing signals should be accounted.

To aid in coordinating actions within processor unit 200, local clock buffers are distributed in various physical locations within processor unit 200. Each local clock buffer generates local timing signals based on global clock 202. Thus, for example, local clock buffer 204 generates local timing signals used by circuits within the vicinity of local clock buffer 204. Similarly, local clock buffer 206 generates local timing signals used by circuits within the vicinity of local clock buffer 206; local clock buffer 208 generates local timing signals used by circuits within the vicinity of local clock buffer 208; and local clock buffer 210 generates local timing signals used by circuits within the vicinity of local clock buffer 210. Each local timing signal generated by each local clock buffer is based on the timing signal generated by global clock 202. Thus, the local clock buffers aid in accurately keeping time, or at least timing actions, within processor unit 200.

Figure 3:
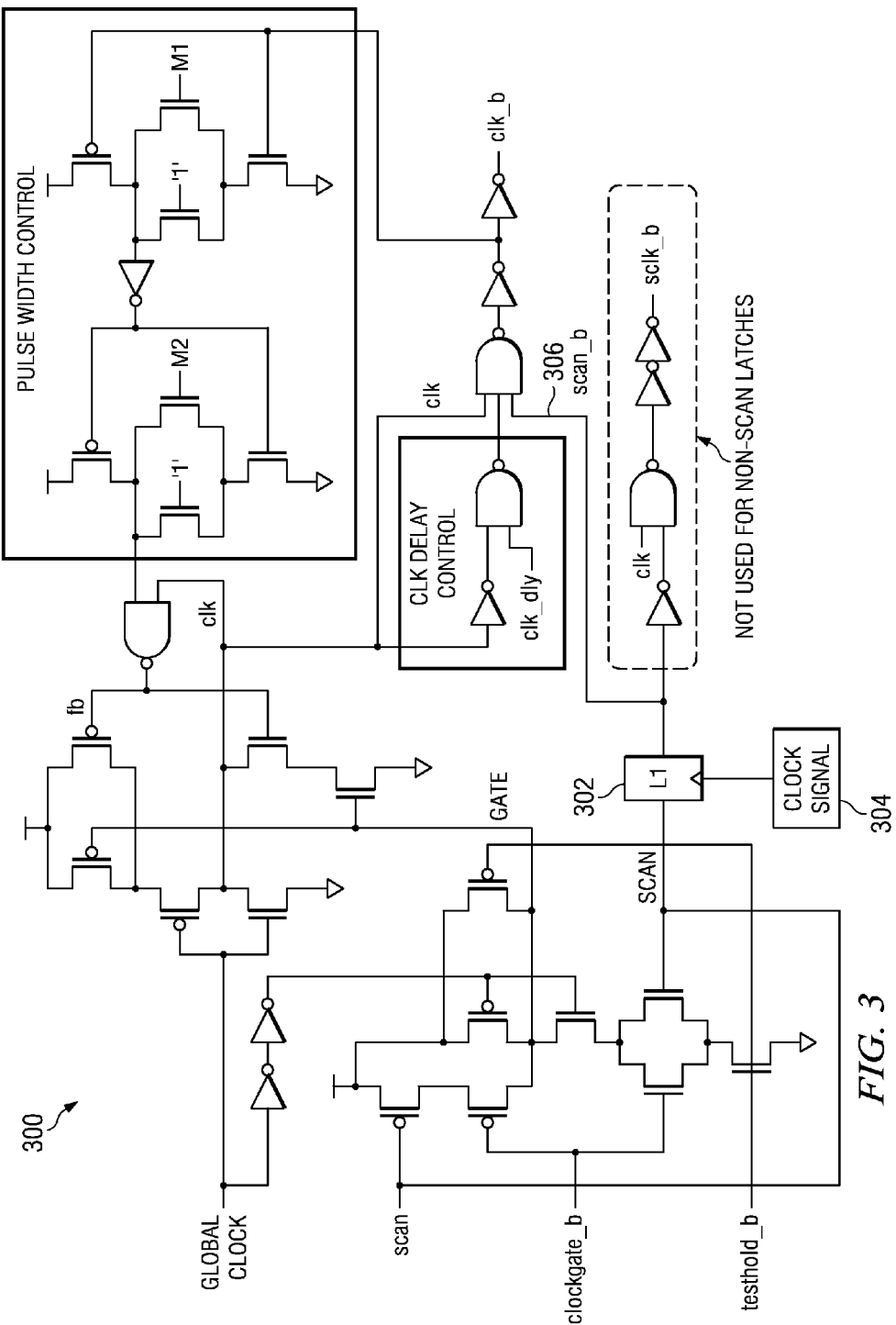
FIG. 3 is a circuit diagram of a local clock buffer, in accordance with an illustrative embodiment.

FIG. 3 is a circuit diagram of a local clock buffer, in accordance with an illustrative embodiment. Local clock buffer circuit 300 can be used to implement any of local clock buffers 204, 206, 208, or 210 shown in FIG. 2; however, other local clock buffer circuits can be used to implement the local clock buffers in FIG. 2.

For local clock buffers with multiple outputs, such as local clock buffer circuit 300, one or more select signals control which clock outputs are active and which clock outputs are inactive. If an output is active during the first half of a processor unit cycle, then the select signals are held at a constant value during the first half of each processor unit cycle. The select signals are allowed to change only in the second half of each processor unit cycle, which corresponds to the time when the local clock buffers are inactive. This constraint on select signals avoids having incorrect clock signals activated part-way through a processor unit cycle. This constraint also avoids truncating clocks if a select signal is deactivated prematurely.

This constraint can be implemented using one or more latches, such as latch L1 302. Timing the operation of latch L1 302 is performed by inputting clock signal 304 into latch L1 302. In an advantageous illustrative example, clock signal 304 can be a timing signal from the global clock. However, in a still further advantageous illustrative example, clock signal 304 can be a timing signal from local clock buffer circuit 300 itself.

The operation of latch L1 302 is first described with respect to clock signal 304 being a timing signal from the global clock. Latch L1 302 ensures that select signal 306 ("scan b") does not change during the first half of a processor unit cycle. In this illustrative example, the first half of a processor unit cycle is the portion of the processor unit cycle when the timing signal from the global clock is "low." Latch L1 302 only transmits a signal from input to output when the timing signal from the global clock is high, thereby ensuring that select signal 306 is stable during the first half of the processor unit cycle.

Although advantageous, this embodiment can be further improved. For example, when using the timing signal from the global clock, each tap from the global clock grid has some amount of physical wire associated with it. The addition of each latch, such as latch L1 302, increases the load on the clock grid. As a result, the overall capacitive load on the processor unit's clock grid increases. Increased capacitive load translates to increased power consumption by the processor unit. Increased power consumption results in increased heat, which possibly can damage the processor unit. Thus, in many high-end processor unit designs, minimizing power consumption is a primary consideration.

Additionally, the capacitance associated with latch L1 302, and any local buffer used to shield an input capacitance of latch L1 302 from the local clock grid will switch twice per cycle. This switching occurs even in the case where no logical need exists for the switching to occur. This problem is exacerbated when multiple latches, such as latch L1 302, are used.

A method of addressing this problem is to add additional circuits to determine when such clocking activity is needed and when such clocking activity is not needed. When not needed, the global clock signal can be gated off from latch L1 302.

However, this solution adds complexity and also adds more physical circuits to a processor unit. As a result, as much or more power may be used relative to a processor unit without the additional circuits. As a result, possibly little is gained in exchange for complexity which can create additional problems, such as testability problems and more opportunities for flaws to arise in the overall processor unit.

Thus, an improved solution to operating latch L1 302 should have a minimal impact on the overall load imposed on the global clock grid. An improved solution would also have some low overhead facility for gating the clock activity to latch L1 302. Such a solution is described with respect to FIG. 4 and FIG. 5, which reflect the still further advantageous illustrative example of using clock signal 304 as a timing signal from local clock buffer circuit 300 itself.

Figure 4:
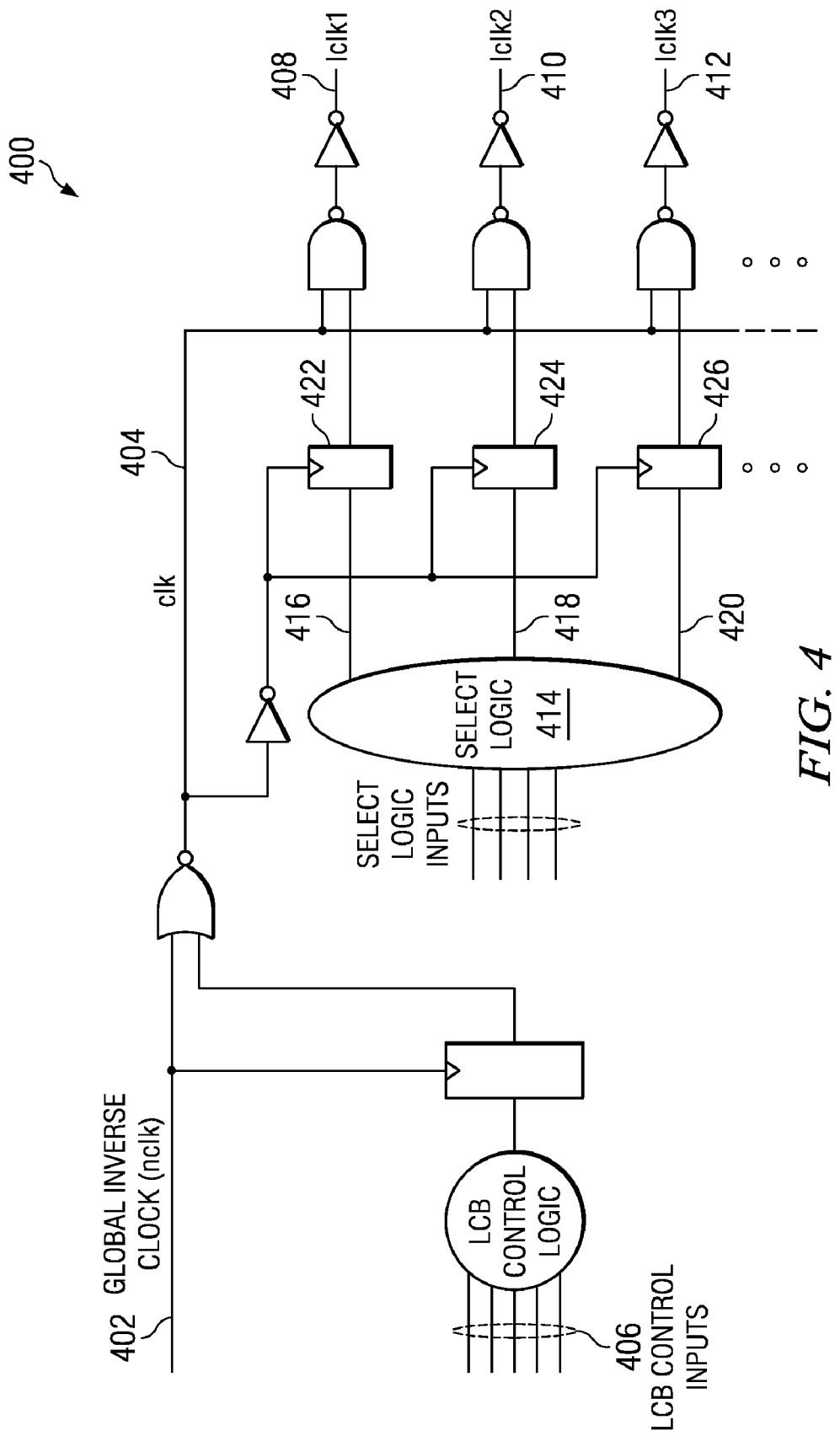
FIG. 4 is a circuit diagram of a low-power multi-output local clock buffer, in accordance with an illustrative embodiment.

FIG. 4 is a circuit diagram of a low-power multi-output local clock buffer, in accordance with an illustrative embodiment. Local clock buffer circuit 400 is an example of a multi-output local clock buffer that consumes less power, relative to a multi-output local clock buffer implemented using a circuit similar to local clock buffer circuit 300 shown in FIG. 3.

In FIG. 4, global clock timing signal 402 ("nclk") is the timing signal from the global clock. In this illustrative example, global clock timing signal 402 is set to be "active-low," meaning that local clock buffer circuit 400 is active when global clock timing signal 402 is low. In turn, local clock signal 404 is the timing signal generated by local clock buffer circuit 400. Local clock signal 404 is based on global clock timing signal 402. Local clock signal 404 is qualified by one or more control logic inputs 406, which may act to suppress propagation of global clock timing signal 402 into the local clock tree.

In the illustrative example of FIG. 4, local clock buffer circuit 400 can produce one or more outputs, such as output lclk1 408, output lclk2 410, or output lclk3 412. Select logic 414 determines which of output lclk1 408, output lclk2 410, and output lclk3 412 are active.

Select outputs 416, 418, and 420 are routed through corresponding latches 422, 424, and 426, each of which is similar to latch L1 302 in FIG. 3. This arrangement ensures that select outputs 416, 418, and 420 are stable whenever output lclk1

408, output lclk2 410, or output lclk3 412 are active. Corresponding latches 422, 424, and 426 can be controlled by local clock signal 404, which is being buffered to drive output lclk1 408, output lclk2 410, or output lclk3 412.

Many logically equivalent variations of the scheme shown in FIG. 4 can be made. For example, corresponding latches 422, 424, and 426 can be moved into or before select logic 414. Alternatively, output lclk1 408, output lclk2 410, and output lclk3 412 can be used to form a combined timing signal for use in clocking corresponding latches 422, 424, and 426. This combined clock signal can be created by inputting the outputs of output lclk1 408, output lclk2 410, and output lclk3 412 into a NOR gate. This arrangement guarantees that the control inputs for lclk1 408, lclk2 410, and lclk3 412 would never change while any of them are active. In this arrangement, select logic 414 should be laid out such that at least one line to the drivers for output lclk1 408, output lclk2 410, and output lclk3 412 would always remain active, since otherwise if clk 404 were high in the first half of the global clock cycle, and all lclk select signals were initially low, then latches 422, 424 and 426 could transmit incoming select signals that might erroneously activate one of the lclk outputs.

Thus, in FIG. 4, the timing of the corresponding latches 422, 424, and 426 is controlled by the timing signal generated by local clock buffer circuit 400 itself. As a result, local clock buffer circuit 400 serves as a buffer between the load capacitance of corresponding latches 422, 424, and 426 and the global clock. Thus, not only is the specific capacitive load on the global clock reduced, but also the processor unit as a whole uses less power over all. Additionally, local clock buffer circuit 400 has some low overhead facility for gating the clock activity. Still further, switching activity of the signals controlling corresponding latches 422, 424, and 426 is naturally gated off from the processor unit grid if local clock buffer circuit 400 is gated off from the processor unit grid. In this manner, the power load on the processor unit is further reduced. When the local clock buffer circuit 400 is gated off from the processor grid, latches 422, 424, and 426 will be open. Thus, the new controlling inputs may be transmitted to the lclk drivers to be ready for a following clock cycle when local clock buffer 400 may be activated.

Thus, the illustrative example provided in FIG. 4 provides for an improved circuit for reducing a capacitance load on a processor. The circuit includes a global clock circuit capable of producing a primary timing signal. The circuit further includes a local clock buffer circuit having a plurality of outputs. The local clock buffer circuit is connected to the global clock circuit. The local clock buffer circuit is capable of producing a secondary timing signal based on the primary timing signal. The circuit also includes a latch connected to the local clock buffer circuit. The latch is capable of producing a select signal that controls which outputs of the plurality of outputs are active. Only a third signal, based on the secondary timing signal, controls an operation of the latch. The third signal can be the secondary timing signal, or can be an inverse of the secondary timing signal. If the circuit has multiple local clock buffer circuits similarly arranged as provided above, then multiple "secondary timing signals" are produced. In this case, the "third signal" can be a combination of these multiple secondary timing signals. The combination can be implemented by inputting the multiple secondary timing signals into a NOR gate.

Additionally, the illustrative example shown in FIG. 4 avoids a connection between the latch and the global clock. Still further, the local clock buffer circuit is capable of holding the select signal at a constant value during a first half of a cycle of the local clock buffer circuit. Thus, the local clock buffer circuit is capable of allowing the select signal to change in a second half of the cycle. Still further, the local clock buffer circuit is capable of, responsive to clock activity being gated off due to de-assertion of a clock gate signal, holding the latch open. Yet further, the local clock buffer circuit is capable of, responsive to the secondary timing signal being low, avoiding clocking of a capacitance of the local clock buffer circuit.

The local clock buffer circuit can be laid out such that a capacitive load imposed by the latch is buffered by the local clock buffer circuit. The local clock buffer circuit can also be laid out such that switching activity of the signal controlling the latch is gated-off when the local clock buffer circuit is gated-off.

Figure 5:
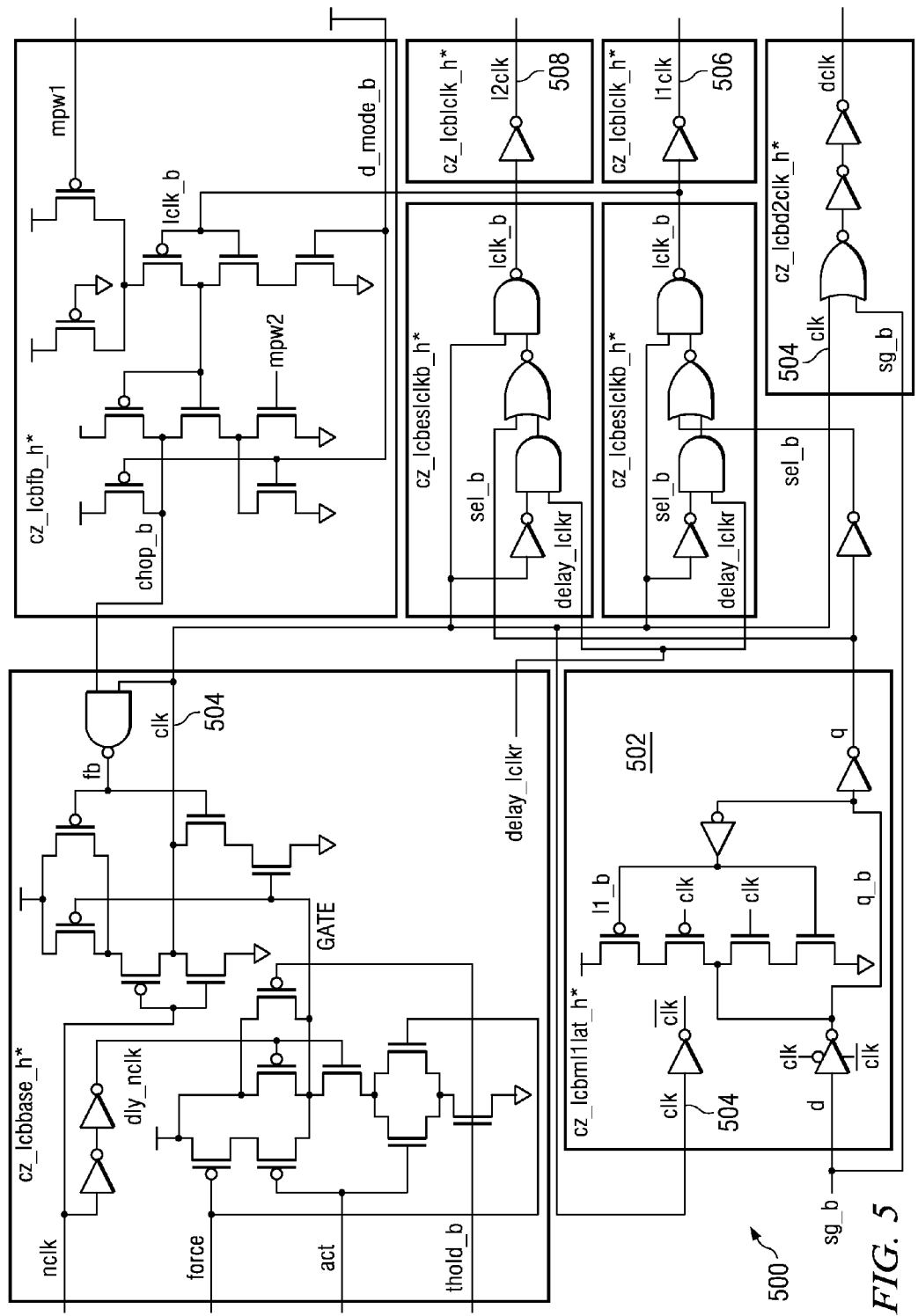
FIG. 5 is a circuit diagram of a low-power multi-output local clock buffer, in accordance with an illustrative embodiment.

FIG. 5 is a circuit diagram of a low-power multi-output local clock buffer, in accordance with an illustrative embodiment. FIG. 5 represents a specific implementation of the illustrative embodiments. Local clock buffer circuit 500 is an example of a local clock buffer that can be implemented in a processor, such as processor unit 102 in FIG. 1 or processor unit 200 in FIG. 2.

Local clock buffer circuit 500 includes component 502, referred to as "cz_lcbml1lat_h*" in FIG. 5. Component 502 shows the circuit design for the latching function shown with respect to FIG. 3 and FIG. 4. Local clock signal 504 drives the latch in component 502. However, in another illustrative example, a timing signal from the global clock can be used to drive the latch in component 502.

The output of component 502 determines whether output l1clk 506 or output l2clk 508 will fire. This scheme ensures that select signal that is used to choose between l1clk 506 and l2clk 508 can never change while local clock signal 504 is high. Additionally, this scheme avoids using a separate global clock tap to guarantee this result. As an additional advantage, the capacitance of component 502 is not clocked whenever local clock buffer circuit 500 is such that local clock signal 504 is held low. As a result, additional power savings are achieved with no additional overhead.

Thus, like the illustrative example provided in FIG. 4, the illustrative example provided in FIG. 5 provides for an improved circuit for reducing a capacitance load on a processor. The circuit includes a global clock circuit capable of producing a primary timing signal. The circuit further includes a local clock buffer circuit having a plurality of outputs. The local clock buffer circuit is connected to the global clock circuit. The local clock buffer circuit is capable of producing a secondary timing signal based on the primary timing signal. The circuit also includes a latch connected to the local clock buffer circuit. The latch is capable of producing a select signal that controls which outputs of the plurality of outputs are active. Only a third signal, based on the secondary timing signal, controls an operation of the latch. The illustrative example provided in FIG. 5 also provides for the other, claimed, features described with respect to FIG. 4.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the illustrative embodiments have been presented for purposes of illustration and description, and is not intended to be exhaustive or limited to the illustrative embodiments in the form disclosed. Many modifications and variations will be apparent to those of ordinary skill in the art. The embodiment was chosen and described in order to best explain the principles of the illustrative embodiments, the practical application, and to enable others of ordinary skill in the art to understand the illustrative embodiments for various embodiments with various modifications as are suited to the particular use contemplated.

What is claimed is:

1. A circuit comprising:
   a global clock circuit capable of producing a primary timing signal;
   a local clock buffer circuit having a plurality of outputs, wherein the local clock buffer circuit is connected to the global clock circuit, and wherein the local clock buffer circuit is capable of producing a secondary timing signal based on the primary timing signal;
   a latch connected to the local clock buffer circuit, wherein the latch is capable of producing a select signal that controls which outputs of the plurality of outputs are active, and wherein only a third signal, based on the secondary timing signal, controls an operation of the latch.

2. The circuit of claim 1 wherein connection between the latch and the global clock is avoided.

3. The circuit of claim 1 wherein the third signal comprises the secondary timing signal.

4. The circuit of claim 1 wherein the third signal comprises an inverse of the secondary timing signal.

5. The circuit of claim 1 wherein the local clock buffer circuit is capable of holding the select signal at a constant value during a first half of a cycle of the local clock buffer circuit, and wherein the local clock buffer circuit is capable of allowing the select signal to change in a second half of the cycle.

6. The circuit of claim 1 wherein the local clock buffer circuit is capable of, responsive to clock activity being gated off due to de-assertion of a clock gate signal, holding the latch open.

7. The circuit of claim 1 wherein the local clock buffer circuit is laid out such that a capacitive load imposed by the latch is buffered by the local clock buffer circuit.

8. The circuit of claim 1 wherein the local clock buffer circuit is laid out such that switching activity of the signal controlling the latch is gated-off when the local clock buffer circuit is gated-off.

9. The circuit of claim 1 further comprising:
   a second local clock buffer circuit having a second plurality of outputs, wherein the second local clock buffer circuit is connected to the global clock circuit, and wherein second the local clock buffer circuit is capable of producing a second secondary timing signal based on the primary timing signal;
   a second latch connected to the second local clock buffer circuit, wherein the second latch is capable of producing a second select signal that controls which outputs of the second plurality of outputs are active, and wherein only a fourth signal, based on the second secondary timing signal, controls an operation of the second latch.

10. The circuit of claim 9 wherein the local clock buffer circuit is capable of generating the third signal and the fourth signal by combining the secondary timing signal and the second secondary timing signal.

11. The circuit 10 wherein the local clock buffer circuit is capable of combining by inputting the secondary timing signal and the second secondary timing signal into a NOR gate.

12. The circuit of claim 1 wherein the local clock buffer circuit is capable of, responsive to the secondary timing signal being low, avoiding clocking of a capacitance of the local clock buffer circuit.

13. A method for controlling operation of a latch connected to a local clock buffer circuit having a plurality of outputs, the method comprising:
   receiving in the local clock buffer circuit a primary timing signal generated by a global clock circuit;
   producing, by the local clock buffer circuit, a secondary timing signal based on the primary timing signal;
   producing, by the latch, a select signal, wherein the select signal controls which outputs of the plurality of outputs are active; and
   controlling operation of the latch using only a third signal, wherein the third signal is based on the secondary timing signal.

14. The method of claim 13 wherein the third signal comprises the secondary timing signal.

15. The method of claim 13 wherein the third signal comprises an inverse of the secondary timing signal.

16. The method of claim 13 further comprising:
   holding the select signal at a constant value during a first half of a cycle of the local clock buffer circuit; and
   allowing the select signal to change in a second half of the cycle.

17. The method of claim 13 further comprising:
   responsive to clock activity being gated off due to de-assertion of a clock gate signal, holding the latch open.

18. The method of claim 13 further comprising:
   producing, by a second local clock buffer circuit, a second secondary timing signal based on the primary timing signal;
   producing, by a second latch connected to the second local clock buffer, a second select signal, wherein the second select signal controls which outputs of a second plurality of outputs of the second local clock buffer are active; and
   controlling operation of the second latch using only a fourth signal, wherein the fourth signal is based on the second secondary timing signal.

19. The method of claim 18 further comprising:
   generating the third signal and the fourth signal by combining the secondary timing signal and the second secondary timing signal.

20. The method of claim 13 further comprising:
   responsive to the local clock buffer circuit being gated-off, gating off the switching activity of the signal controlling latch.

* * * * *